United States Patent [19]

Gentile et al.

[11] Patent Number: 4,501,978
[45] Date of Patent: Feb. 26, 1985

[54] LEVEL SHIFT INTERFACE CIRCUIT

[75] Inventors: Carmine J. Gentile, Hightstown; Melvin L. Hagge, Bridgewater, both of N.J.; Robert C. Croes, Nijmegen, Netherlands

[73] Assignee: RCA Corporation, New York, N.Y.

[21] Appl. No.: 444,459

[22] Filed: Nov. 24, 1982

[51] Int. Cl.³ .............. H03K 19/017; H03K 19/094; H03K 19/092
[52] U.S. Cl. ............................. 307/475; 307/443; 307/279
[58] Field of Search ............ 307/443, 446, 475, 279, 307/270

[56] References Cited

U.S. PATENT DOCUMENTS

| | | | |
|---|---|---|---|
| 3,509,379 | 4/1970 | Rapp | 307/279 |
| 3,675,144 | 7/1972 | Zuk | 307/443 X |
| 4,080,539 | 3/1978 | Stewart | 307/279 X |
| 4,216,390 | 8/1980 | Stewart | 307/270 X |
| 4,258,272 | 3/1981 | Huang | 307/475 |
| 4,295,065 | 10/1981 | Hsieh et al. | 307/475 |
| 4,365,316 | 12/1982 | Iwahashi et al. | 307/448 X |

OTHER PUBLICATIONS

Dingwall, "TTL-to-CMOS Buffer Circuit"; *RCA Technical Notes;* TN No.: 1114; 3 pp.; 6/1975.

*Primary Examiner*—Larry N. Anagnos
*Attorney, Agent, or Firm*—Joseph S. Tripoli; George E. Haas; Henry I. Schanzer

[57] ABSTRACT

A voltage dropping element is connected in series with the conduction paths of first and second IGFETs, of complementary conductivity, between first and second terminals coupled to first (e.g. 5 volts) and second (e.g. 0 volt) voltage levels, respectively. The gates of the IGFETs are connected to an input terminal to which is applied TTL level signals (e.g. 0.4 to 2.4 volts) and their drains are connected to an output node. When the "high" TTL level (e.g. 2.4 volt) is present, the voltage dropping element reduces the effective gate-to-source voltage ($V_{GS}$) of the first IGFET, reducing its conductivity, increasing its effective impedance substantially, and enabling the second IGFET to drive the output node to the second voltage level with little power dissipation. When the "low" TTL input (e.g. 0.4 volt) is present, the second IGFET is turned-off while the first IGFET is turned-on, driving the output node to the voltage at the first power terminal less the voltage drop of the voltage dropping element. A regenerative latch circuit connected to the output node senses the turn-on of the first IGFET and couples the output node to the voltage at the first power terminal eliminating the voltage offset at the output node due to the voltage dropping element.

13 Claims, 7 Drawing Figures

LEVEL SHIFT INTERFACE CIRCUIT

This invention relates to an interface circuit operable as a level shift circuit.

The invention is best understood by reference to the accompanying drawing in which like reference characters denote like components and in which.

It is often necessary and/or desirable to operate different parts of an electronic system at different voltage levels. At the places where the different parts interface, they must be coupled to each other. However, the signals at the interfaces are not necessarily compatible. It is, therefore, necessary to provide interface and level shift circuits which can render one part of the system compatible with the other. For an interface or level shift circuit to be useful, it must be compatible with the other circuits of the system with respect, among other things, to speed of operation, number of components and minimization of power dissipation.

Figure 1A:
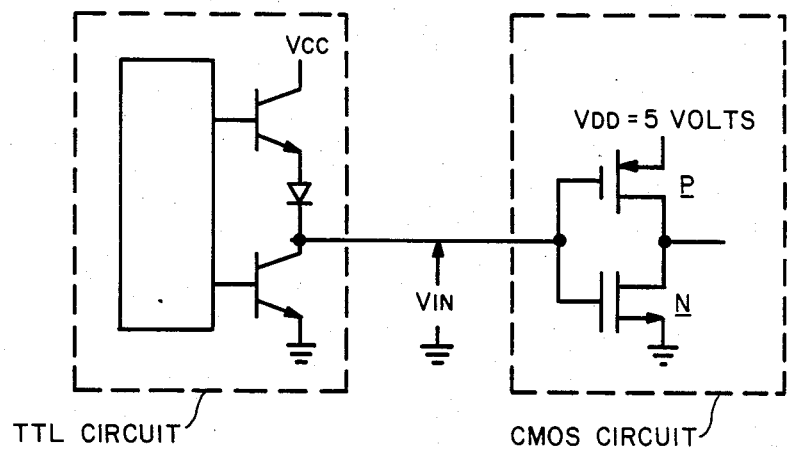
FIG. 1A is a schematic diagram of a prior art circuit.
Figure 1B:
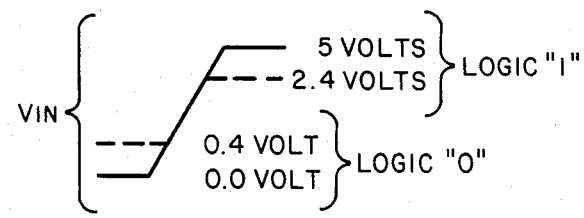
FIG. 1B is a diagram of typical logic levels produced by a transistor transistor logic (TTL) circuit.

By way of example, a problem which exists in interfacing the output signal of a transistor transistor logic (TTL) circuit to the input of a complementary metal oxide semiconductor (CMOS) circuit is best illustrated by reference to FIG. 1A. The TTL input signal, denoted as $V_{IN}$ and shown in FIG. 1B, has a logic "1" or "high" level which ranges from approximately 2.4 volts to 5 volts, and a logic "0" or "low" level which ranges from 0 volts to 0.4 volt. The worst case condition for distinguishing between the "high" and "low" TTL levels occurs for a "high" level of 2.4 volts and for a "low" level of 0.4 volt.

In CMOS circuits it is conventional to have an input buffer comprised of series connected P-channel and N-channel insulated-gate field-effect transistors (IGFETs) forming a "complementary inverter". Where the operating voltage ($V_{DD}$) to the CMOS circuit is, for example, 5 volts, the logic "1" and "0" signal should be close to 5 volts and 0 volts, respectively, to ensure that when one of the two IGFETs is turned-on the other one is turned-off. However, where the "highest" $V_{IN}$ is 2.4 volts a problem exists because both the P and the N channel IGFETs are turned-on simultaneously. This results in a relatively low impedance path between $V_{DD}$ and ground and may produce an unacceptably high power dissipation level. To avoid this problem, and to assure stable states at the 0.4 volt and 2.4 volts input levels, the prior art suggests that the impedance of the P-channel IGFET should be made much larger (typically at least 10 times greater) than the impedance of the N-channel IGFET when both are conducting; i.e., the size of the N-IGFET is made much larger than that of the P-IGFET. The large "skew" of the input inverter enables the output to be defined for TTL inputs but leads to many other problems.

First, for full rail-to-rail input signals (0-5 volts) where skewing of the input buffer is not required, the response of the input buffer is rendered highly asymmetrical. The very small drive capability of the P-IGFET (compared to the N-IGFET) results in greatly increased delays for input signal transitions of one polarity (e.g. 2.4 volts to 0.4 volt) compared to those of opposite polarity. The circuit response is therefore delayed in one direction and the circuit operation is severely degraded.

Another problem is the high power dissipation of the inverter in response to TTL level inputs. A major advantage of CMOS technology is its extremely low standby power dissipation—on the order of microwatts. However, the low power dissipation is specified only with full rail-to-rail CMOS input levels. The static power dissipation with TTL level inputs can be orders of magnitude higher—in the milliwatt range. Increasing the impedance of the P and N channel devices decreases the power dissipation. However, this is not a suitable solution in high speed circuits, since the impedance of the P devices would have to be made much larger than that of the N device and the time to charge or discharge nodal capacitances would become too long. On the other hand, increasing the size of the devices (decreasing their impedance) reduces delays but aggravates the power dissipation problem. Also, the requirement for a large geometry N-IGFET compared to the P-IGFET presents problems in the layout and fabrication of the circuit.

In short, a problem exists where a complementary inverter operated, for example, between 0 and 5 volts must, in response to signals varying, for example, between 0.4 and 2.4 volts, be capable of producing, with very little delay and in a generally symmetrical fashion, output signals close to 0 or 5 volts, and must do so without significant power dissipation while using few components.

In circuits embodying the invention a voltage dropping element is connected in series with the source-to-drain path of a first IGFET between a first power terminal and an output node. The drain-to-source path of a second IGFET is connected between the output node and a second power terminal, and the gate electrodes of the first and second IGFETs are connected to an input terminal. The voltage dropping element reduces the effective gate-to-source voltage applied to the first IGFET thereby enabling the first IGFET to be turned-off or to have its conduction significantly reduced even when the input signal has a value between the voltages at the first and second power terminals. The circuit also includes a regenerative latch coupled to the output node or to the source of the first IGFET which senses the turn-on of the first IGFET and clamps the output node to the voltage at the first power terminal to eliminate a potential voltage offset at the output node resulting from the offset of the voltage dropping element when the input voltage is at, or close to, the voltage at the second terminal.

In this application, insulated-gate field-effect transistors (IGFETs) are used to illustrate the invention. IGFETs of P-conductivity type are denoted by the letter P followed by a particular reference character and IGFETs of N-conductivity type are denoted by the letter N followed by a particular reference character.

Figure 2:
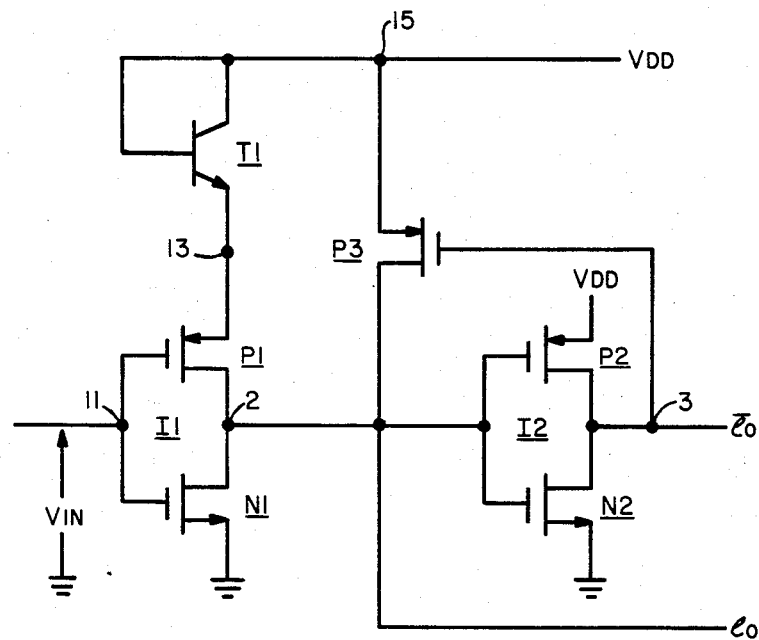
FIG. 2 is a schematic diagram of a circuit embodying the invention.
Figure 2:
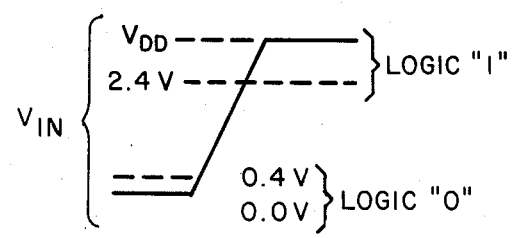

The circuit of FIG. 2 includes an input terminal 11 to which is applied an input signal $V_{IN}$ from a TTL source (not shown). $V_{IN}$ may vary as shown in FIG. 2 from a "low" condition which ranges between 0 volts and 0.4 volt and a "high" condition which ranges between 2.4 volts and $V_{DD}$ volts. In this application $V_{DD}$ is assumed to be equal to +5 volts.

The circuit includes a complementary inverter I1 comprised of IGFETs P1 and N1. The gate electrodes of N1 and P1 are connected to terminal 11 and their drains are connected to a node 2. The source electrode of N1 is returned to ground and the source electrode of P1 is connected to node 13 to which is connected the emitter of a bipolar NPN transistor T1. The base and collector of T1 are connected to terminal 15 to which is applied $V_{DD}$ volts. T1 is connected as a diode and functions as a voltage dropping element, as detailed below. A complementary inverter I2 comprising IGFETs P2 and N2 is connected at its input to node 2 and at its output to node 3 and to the gate of an IGFET P3. The conduction path of IGFET P3 is connected between node 2 and terminal 15. Inverter I2 is shown to be a complementary inverter but could be, instead, any one of a known number of high input impedance inverters.

The operation of the circuit of FIG. 2 will be examined for the condition when the input signal ($V_{IN}$) is "low" (between 0 volts and 0.4 volt), and then for the condition when $V_{IN}$ is "high" (a minimum of 2.4 volts). In the discussion to follow, it is assumed that $V_{DD}$ is at 5.0 volts.

(a) When $V_{IN}$ is at or below 0.4 volt, N1 is turned-off. Due to the voltage drop across T1, the source of P1 is at $[V_{DD}-V_{BE}]$ volts where $V_{BE}$ is the base-to-emitter drop of transistor T1 and may be assumed to be equal to 0.6 volt. Thus, with $V_{DD}$ equal to 5 volts the source of P1 is at 4.4 volts. When $V_{IN}$ is "low", the gate of P1 is at a maximum of 0.4 volt, and its source is at 4.4 volts whereby its gate-to-source voltage ($V_{GS}$) is equal to 4.0 volts. Hence, P1 is turned-on hard, and conducts in the common source mode raising the voltage ($V_2$) at node 2 close to $[V_{DD}-V_{BE}]$ volts. In the absence of additional circuitry, T1 in series with the conduction path of P1 causes the voltage ($V_2$) at node 2 to be offset by $V_{BE}$ volts; that is, $V_2$ would be a maximum of $[V_{DD}-V_{BE}]$ volts. However, the final voltage at node 2 is determined by the combination of P3 and inverter I2 which functions to overcome and remove the offset. Assume the transition point of I2 to be around $V_{DD}/2$, which exists when P2 and N2 are designed to have approximately equal impedances for like bias conditions. Consequently, whenever the potential at node 2 is above $V_{DD}/2$, N2 conducts more than P2 causing the potential ($V_3$) at node 3 to go towards ground potential. This causes P3 to turn-on, causing the potential at node 2 to go still further above $V_{DD}/2$ (and towards $V_{DD}$), causing N2 to conduct harder and P2 to be driven towards cut-off. The regenerative feedback between N2 and P3 ensures that N2 and P3 are turned-on hard and that P2 is fully turned-off. That is, the offset at node 2 due to T1 connected in series with the conduction path of P1 is eliminated when P3 is turned-on. In the absence of P3, P2 might conduct slightly if its $V_T$ was abnormally low and the $V_{BE}$ of T1 was abnormally high. Consequently, when $V_{IN}$ is low (i.e. between 0 and 0.4 volt), node 2 is at, or close to, $V_{DD}$ volts whereby P2 is OFF and N2 is ON hard and V3 is "low" (i.e. at, or close to, 0 volts), causing P3 to be turned-on hard. Thus, when $V_{IN}$ is low there is no steady state or static power dissipation within the circuit since N1 is also fully turned-off.

(b) When $V_{IN}$ makes a transition from the "low" level to 2.4 volts, N1 turns-on. P1 with 2.4 volts applied to its gate electrode and with its source electrode at 4.4 volts (i.e. $V_{DD}-V_{BE}$ of T1) has a gate-to-source voltage ($V_{GS}$) of 2.0 volts. Assuming the $V_T$ of P1 to be equal to 0.7 volt, P1 is slightly turned-on. The turn-on of N1 which is a larger device than P1 ensures that node 2 is driven "low", i.e. close to ground potential. The "low" applied to the input of inverter I2 causes N2 to turn-off and P2 to turn-on whereby its output goes high causing P3 to turn-off. Thus, the combination of P3 and I2 dissipates no static power.

The voltage dropping element T1 functions to decrease the gate-to-source potential ($V_{GS}$) of P1 and the current flowing through P1.

T1 connected as a diode functions to reduce the gate-to-source voltage ($V_{GS}$) of P1 by approximately one diode voltage drop and to limit the current which can flow through P1 when $V_{IN}$ is at the TTL logic "1" (i.e. 2.4 volts). For purpose of illustration a worst case minimum $V_{IN}$ high of 2.4 volts has been assumed. However, in many applications the minimum $V_{IN}$ high is 2.7 volts and the "typical $V_{IN}$ high" is 3.5 volts. In decreasing the $V_{GS}$ of P1, T1 causes P1 to behave like a relatively high impedance when $V_{IN}$ is at a minimum "high" of 2.4 volts. N1, turned-on by the 2.4 volt input, can then pull node 2 to, or close to, ground potential.

The presence of T1 is important in reducing the power dissipation in input inverter I1. In the absence of T1, if the source of P1 were directly connected to $V_{DD}$, P1 in the worst case condition, when $V_{IN}$ is at 2.4 volts and $V_{DD}$ is at 5 volts, would have 2.6 volts applied between its gate and source electrodes. With T1 in the circuit, the maximum $V_{GS}$ of P1 is 2 volts which results in a significant decrease in the power dissipation of the inverter without significant decrease in speed or symmetry of the output signal. Simulation tests indicate that the insertion of T1 decreases the current level through I1 by a factor of 100 in the typical case where $V_{IN}$ is at 3.5 volts and $V_{DD}$ is at 5 volts.

In addition to its effect on the impedance of P1, the use of T1 enables the size of transistor N1 to be reduced, thereby saving space on the integrated circuit. As discussed above, in the absence of T1, N1 must be made 7 to 10 times the size of P1 in order to handle the TTL level inputs. The "ratioing" of N1 to P1 is necessary to ensure that, when $V_{IN}$ is at the minimum high level, $V_2$ is significantly less than $V_{DD}/2$. With T1 in the circuit, N1 need be made only 2 to 3 times the size of P1. This results in more symmetrical output at nodes 2 and 3.

Figure 3:
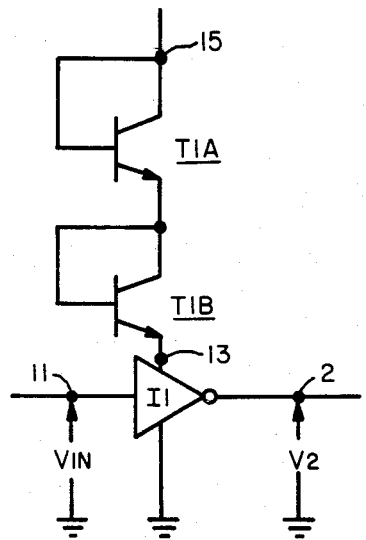
FIG. 3 is a schematic diagram of a portion of another circuit embodying the invention.

In order to achieve high speed of response, only a single voltage dropping element is used in the circuit of FIG. 2. Where slightly slower operation is acceptable, two (or more) diodes or like voltage dropping elements may be used. This is illustrated in FIG. 3 where two transistors (T1A and T1B), interconnected to function as diodes, are connected in series between the source of P1 and terminal 15. T1A and T1B, connected in series between terminals 13 and 15, cause the source voltage of P1 to be at, or close to, $[V_{DD}-2V_{BE}]$ volts. Assume as before that $V_{BE}$ is 0.6 volt and that the $V_T$ of P1 is 0.7 volt. In response to a "low" input applied to terminal 11, N1 turns-off and P1 turns-on causing $V_2$ to go towards $[V_{DD}-2V_{BE}]$ volts. For $V_{DD}=5$ volts and $V_{BE}$ equal to 0.6 volt, $V_2$ would be approximately equal to 3.8 volts. Thus, in the absence of additional circuits there would be an offset of 2 $V_{BE}$ volts at V2. However, the addition of the regenerative latch comprised of I2 and P3 (as shown in FIG. 2) would eliminate the offset and cause node 2 to be clamped to $V_{DD}$ volts via P3.

Hence, as long as the combination of the voltage dropping elements and P1 produce a voltage at node 2 which is more positive than the switching point of inverter I2, the combination of I2 and P3 can compensate for the offset and clamp node 2 to $V_{DD}$ volts.

With the two diodes connected in series with the gate-to-source of P1, the potential at the source of P1 is 3.8 volts, and since the $V_T$ of P1 is 0.7 volt, the potential at the gate of P1 must be less than 3.1 volts to turn it on. Hence, for $V_{IN}$ of 3.1 volts or more, P1 is at cut-off and it behaves like an extremely high impedance.

In response to a "high" input of 2.4 volts applied to terminal 11, N1 is turned-on hard and P1 is close to cut-off and behaves like a high impedance. Adding two (or more) diodes reduces the power dissipation of I1 considerably when $V_{IN}$ is at the minimum high level. Another diode (not shown) could be added in series with T1A and T1B, however, this tends to slow down the response of the circuit since the interelement nodal capacitances must be charged and discharged.

T1, T1A and T1B shown to be NPN bipolar transistors could be replaced by PNP transistors appropriately connected to provide similar voltage drops.

Figures 4A, 4B:
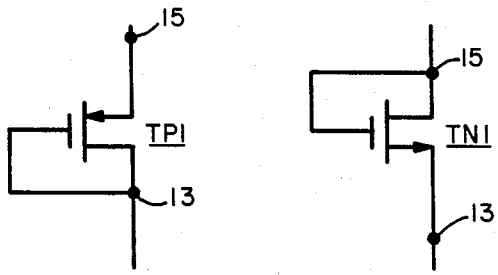
FIGS. 4A and 4B are schematics of insulated-gate field-effect transistors (IGFETs) connected as diodes which may be used in circuits embodying the invention.

In FIGS. 2 and 3, bipolar transistors connected to perform a diode function are shown as the voltage dropping element. These particular elements were used because they respond quickly and have a well defined characteristic. However, regular diodes can be used and as shown in FIG. 4, a P-type IGFET (TP1) or an N-type IGFET (TN1) each with its gate connected to its drain could be used as a voltage dropping element. In general, any element which provides a voltage drop great enough to keep the power consumption of the circuit at an acceptably low level without degrading speed performance could be used instead of T1.

The voltage drop of the voltage dropping elements (e.g. TP1, TN1, T1, T1A and T1B) illustrated for use in the circuits of FIGS. 2 and 3 is dependent to some extent on the current flowing through the element. This characteristic enhances the role of these elements. Referring to FIG. 3, by way of example, when $V_{IN}$ is low, P1 is turned-on and charges node 2 towards [$V_{DD}-2 V_{BE}$] volts. $V_{BE}$ was assumed to be a fixed 0.6 volt. However, as node 2 charges up (and in the absence of a dissipative load at node 2), the current through T1A and T1B decreases substantially causing the voltage drop across T1A and T1B to decrease. This tends to cause node 2 to rise (independently of P3 or in the absence of P3) closer towards $V_{DD}$ volts.

When $V_{IN}$ is a minimum high and there is conduction through P1 and N1, there is also conduction through T1A and T1B. The higher the current conduction through these elements the higher is the voltage drop across them. As the voltage drop across the voltage dropping elements increases, conduction through P1 is decreased. Hence, the current-voltage characteristic of the voltage dropping element (e.g. TP1, TN1, T1, T1A and T1B) functions to aid in limiting power dissipation under the worst case conditions.

The circuits of FIGS. 2 and 3 are capable of functioning as input buffers at high speed, using few components and with significantly reduced power consumption.

In the circuits of FIGS. 2 and 3, $V_{IN}$ is only applied to the gate electrodes of IGFETs. Thus, the TTL output only sees the extremely high impedance (essentially open circuit) characteristic associated with the gates of the IGFETS.

Figure 5:
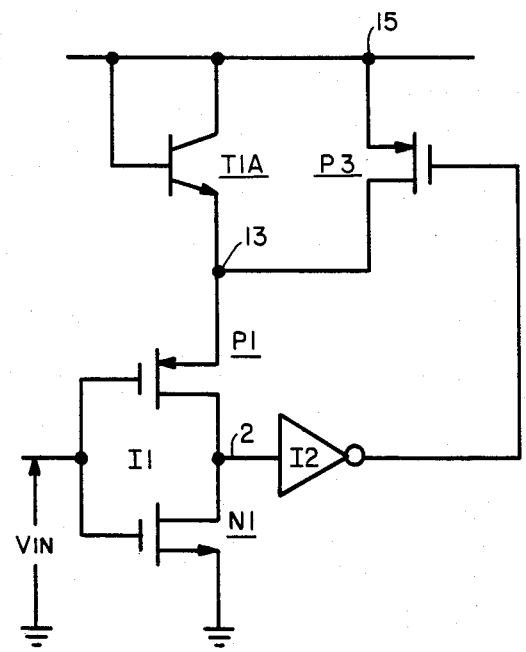
FIG. 5 is a schematic diagram of another circuit embodying the invention.

In the circuit of FIGS. 2 and 3, the feedback transistor P3 is connected between $V_{DD}$ (node 15) and the output (node 2) of inverter I1. However, as shown in FIG. 5, the conduction path of P3 may be connected between nodes 15 and 13 and functions to pull node 13 up towards $V_{DD}$ when $V_{IN}$ goes "low".

What is claimed is:

1. An interface circuit comprising:
   first and second insulated-gate field-effect transistors (IGFETs) of complementary conductivity type, each IGFET having source and drain electrodes defining the ends of a conduction path, and a control electrode;
   a signal input terminal responsive to an input signal having a first voltage level and a second voltage level, a signal output terminal, and
   first and second power terminals for the application therebetween of an operating potential greater in potential difference than the two voltage levels of the input signal;
   means connecting the control electrodes of said first and second IGFETs to said signal input terminal;
   means connecting the drain electrodes of said first and second IGFETs to said signal output terminal;
   means connecting said source of said second IGFET to said second power terminal;
   a relatively constant voltage dropping means, having a relatively constant voltage offset, connected between said source of said first IGFET and said first power terminal for producing a reduced voltage at said source electrode of said first IGFET;
   a third IGFET of same conductivity type as said first IGFET having source and drain electrodes defining the ends of a conduction path and a control electrode;
   means connecting one end of the conduction path of said third IGFET to said first power terminal and means connecting the other end of the conduction path of said third IGFET to said source of said first IGFET; and
   an inverter connected at its input to said signal output terminal and at its output to the control electrode of said third IGFET, and said inverter providing at its output a signal ranging between the voltages at said first and second power terminals.

2. The combination as claimed in claim 1 wherein said voltage dropping means comprises a bipolar transistor having its base and collector connected to one of said first power terminal and the source electrode of said first IGFET and having its emitter electrode connected to the other one of said first power terminal and the source electrode of said first IGFET.

3. The combination as claimed in claim 2 wherein said inverter is a complementary inverter comprised of two IGFETs of complementary conductivity type.

4. The combination as claimed in claim 1 wherein said voltage dropping means comprises an IGFET having its gate and drain connected to one of said first power terminal and the source electrode of said first IGFET and having its source connected to the other one of said first power terminal and the source electrode of said first IGFET.

5. The combination as claimed in claim 1 wherein said voltage dropping means consists solely of a single bipolar transistor having its base and collector connected to one of said first power terminal and the source electrode of said first IGFET and having its emitter electrode connected to the other one of said first power terminal and the source electrode of said first IGFET.

6. The combination as claimed in claim 5 wherein said input signal terminal is responsive to input signals having either a first value approximately equal to the potential applied to said second power terminal or a second value equal to a voltage intermediate the voltages applied to said first and second power terminals.

7. The combination as claimed in claim 1 wherein said relatively constant voltage dropping means conducts current in a unidirectional direction.

8. A level shift interface circuit comprising:
first and second power terminals for the application thereto of first and second operating voltages, respectively;
an input signal terminal for receiving signals varying between a "low" level approximately equal to the voltage at said second power terminal and a "high" level intermediate said first and second operating voltages;
first and second output terminals for driving loads;
first, second, third, fourth and fifth insulated-gate field-effect transistors (IGFETs), each IGFET having source and drain electrodes defining the ends of a conduction path, and a control electrode; said first, third and fifth IGFETs being of one conductivity type and said second and fourth IGFETs being of complementary conductivity type;
means connecting the control electrodes of said first and second IGFETs to said signal input terminal;
means connecting said source electrode of said second IGFET to said second power terminal;
a relatively constant voltage dropping means, having a relatively constant voltage offset, connected between said source electrode of said first IGFET and said first power terminal for producing a reduced voltage at said source electrode of said first IGFET;
means connecting the drain electrodes of said first and second IGFETs to said first output terminal for producing thereat either a voltage approximately equal to said reduced voltage when said first IGFET is first turned-on in response to a "low" level input signal, or a voltage approximately equal to said second operating voltage when said second IGFET is turned-on in response to a "high" level input signal;
means interconnecting said third and fourth IGFETs to form a complementary inverter, including means connecting the source of said third IGFET to said first power terminal, the source of said fourth IGFET to said second power terminal, the control electrodes of said third and fourth IGFETs to said first output terminal and their drains to said second output terminal for producing at said second output terminal either a first signal which makes a transition from said first and said second operating voltage in response to said "low" level input or a second signal which goes from said second to said first operating voltage in reponse to said "high" level input; and
means connecting the source-to-drain path of said fifth IGFET between said first power terminal and one of said first output terminal and said source of said first IGFET, and means connecting its control electrode to said second output terminal for, in response to said low level signal at said input terminal, turning-on said fifth IGFET and, concurrently, (a) quickly raising the level at said first output terminal towards the potential at said first power terminal,
(b) establishing the full value of said first operating voltage at said first output terminal,
(c) positively driving any load connected to said first output terminal to the voltage at said first power terminal,
(d) turning-off said third IGFET regardless of the value of its threshold voltage relative to the value of the offset of said voltage dropping means, and
(e) producing complementary signals at said first and second output terminals which can swing fully between said first and second operating voltages.

9. In the circuit as claimed in claim 8 wherein said voltage dropping means comprises a bipolar transistor having its base and collector connected to one of said first power terminal and the source electrode of said first IGFET and having its emitter electrode connected to the other one of said first power terminal and the source electrode of said first IGFET.

10. In the circuit as claimed in claim 8 wherein said voltage dropping means comprises an IGFET having its gate and drain connected to one of said first power terminal and the source electrode of said first IGFET and having its source connected to the other one of said first power terminal and the source electrode of said first IGFET.

11. The combination as claimed in claim 8 wherein said relatively constant voltage dropping means conducts current in a unidirectional direction.

12. An interface circuit comprising:
first, second, third, fourth and fifth insulated-gate field-effect transistors (IGFETs), each IGFET having source and drain electrodes defining the ends of a conduction path, and a control electrode; said first, third and fifth IGFETs being of one conductivity type and said second and fourth IGFETs being of complementary conductivity type;
a signal input terminal responsive to an input signal having a first voltage level and a second voltage level, first and second output terminals, and first and second power terminals for the application therebetween of an operating potential greater in potential difference than the input voltage levels of the input signal;
means connecting the control electrodes of said first and second IGFETs to said signal input terminal;
means connecting the drain electrodes of said first and second IGFETs and the control electrodes of said third and fourth IGFETs to said first output terminal;
means connecting the source electrodes of said second and fourth IGFETs to said second power terminal;
means connecting the drain electrodes of said third and fourth IGFETs to said second signal output terminal;
a relatively constant voltage dropping means, having a relatively constant voltage offset, connected between said first power terminal and the source of said first IGFET, said voltage dropping means providing a voltage offset between said first power terminal and said source of said first IGFET such that the magnitude of the voltage at said source of said first IGFET is lower than the magnitude of the voltage at said first power terminal, said voltage dropping means having a value normally less than the threshold voltage ($V_T$) of said third IGFET;

means connecting the source electrodes of said third and fifth IGFETs to said first power terminal; and means connecting the drain electrode of said fifth IGFET to said first signal output terminal and its control electrode to said second output terminal for, when said fifth IGFET is turned-on, (a) clamping said first signal output terminal to the first power terminal for turning-off said third transistor even when the value of said given offset is equal to or greater than the $V_T$ of said third IGFET, thereby compensating for variations in the threshold voltage of said third transistor and in the offset of said voltage dropping means; and (b) concurrently enabling the potential at said first output terminal to quickly rise to the full value of potential present at said first power terminal.

13. The combination as claimed in claim 12 wherein said relatively constant voltage dropping means conducts current in a unidirectional direction.

* * * * *

UNITED STATES PATENT AND TRADEMARK OFFICE
CERTIFICATE OF CORRECTION

PATENT NO. : 4,501,978

DATED : Feb. 26, 1985

INVENTOR(S) : Gentile et al.

It is certified that error appears in the above-identified patent and that said Letters Patent is hereby corrected as shown below:

Col. 7, line 58, change "and" to - - - to - - -.

Signed and Sealed this

Fifth Day of November 1985

[SEAL]

Attest:

Attesting Officer

DONALD J. QUIGG

Commissioner of Patents and Trademarks

UNITED STATES PATENT AND TRADEMARK OFFICE
CERTIFICATE OF CORRECTION

PATENT NO. : 4,501,978

DATED : Feb. 26, 1985

INVENTOR(S) : Gentile et al.

It is certified that error appears in the above-identified patent and that said Letters Patent is hereby corrected as shown below:

On the title page, item [73] Assignee: after "RCA Corporation, New York, N.Y." add --- and U. S. Philips Corporation --.

Signed and Sealed this

Seventh Day of October, 1986

[SEAL]

*Attest:*

DONALD J. QUIGG

*Attesting Officer*    *Commissioner of Patents and Trademarks*